US011888032B2

(12) United States Patent
Leendertz et al.

(10) Patent No.: US 11,888,032 B2
(45) Date of Patent: Jan. 30, 2024

(54) METHOD OF PRODUCING A SILICON CARBIDE DEVICE WITH A TRENCH GATE

(71) Applicant: Infineon Technologies AG, Neubiberg (DE)

(72) Inventors: Caspar Leendertz, Munich (DE); Thomas Basler, Chemnitz (DE); Paul Ellinghaus, Unterhaching (DE); Rudolf Elpelt, Erlangen (DE); Michael Hell, Erlangen (DE); Jens Peter Konrath, Villach (AT); Shiqin Niu, Freising (DE); Dethard Peters, Hoechstadt (DE); Konrad Schraml, Feldkirchen (DE); Bernd Leonhard Zippelius, Erlangen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/073,860

(22) Filed: Dec. 2, 2022

(65) Prior Publication Data

US 2023/0094032 A1    Mar. 30, 2023

Related U.S. Application Data

(63) Continuation of application No. 16/986,338, filed on Aug. 6, 2020, now Pat. No. 11,552,173.

(30) Foreign Application Priority Data

Aug. 14, 2019  (DE) .......................... 102019121859.4

(51) Int. Cl.
*H01L 29/16*    (2006.01)
*H01L 29/10*    (2006.01)
(Continued)

(52) U.S. Cl.
CPC ...... *H01L 29/1608* (2013.01); *H01L 29/1095* (2013.01); *H01L 29/4236* (2013.01); *H01L 29/7813* (2013.01)

(58) Field of Classification Search
CPC ............. H01L 29/1608; H01L 29/1095; H01L 29/4236; H01L 29/7813
(Continued)

(56) References Cited

U.S. PATENT DOCUMENTS 9,136,372 B2    9/2015  Miyahara et al.
2007/0114602 A1    5/2007  Saito et al.
(Continued)

FOREIGN PATENT DOCUMENTS

DE    102010027886 A1    11/2010
DE    102017110969 A1 *    11/2017  ............. H01L 29/04
(Continued)

*Primary Examiner* — Igwe U Anya
(74) *Attorney, Agent, or Firm* — Murphy, Bilak & Homiller, PLLC

(57) ABSTRACT

A method of producing a silicon carbide (SiC) device includes: forming a stripe-shaped trench gate structure that extends from a first surface of a SiC body into the SiC body, the gate structure having a gate length along a lateral first direction, a bottom surface and a first gate sidewall of the gate structure being connected via a first bottom edge of the gate structure; forming at least one source region of a first conductivity type; and forming a shielding region of a second conductivity type in contact with the first bottom edge of the gate structure across at least 20% of the gate length. Forming the shielding region includes: forming a deep shielding portion; and forming a top shielding portion between the first surface and the deep shielding portion, the top shielding portion being in contact with the first bottom edge.

20 Claims, 11 Drawing Sheets

(51) Int. Cl.
    *H01L 29/423*    (2006.01)
    *H01L 29/78*    (2006.01)
(58) Field of Classification Search
    USPC .......................................................... 257/77
    See application file for complete search history.

(56) References Cited

U.S. PATENT DOCUMENTS

| | | |
|---|---|---|
| 2009/0114969 A1 | 5/2009 | Suzuki et al. |
| 2011/0018029 A1 | 1/2011 | Pfirsch et al. |
| 2014/0021484 A1 | 1/2014 | Siemieniec et al. |
| 2017/0345905 A1 | 11/2017 | Siemieniec et al. |
| 2018/0175150 A1 | 6/2018 | Mauder et al. |
| 2018/0175153 A1* | 6/2018 | Schulze .............. H01L 29/1095 |
| 2018/0308938 A1* | 10/2018 | Siemieniec ......... H01L 29/1608 |
| 2019/0296141 A1 | 9/2019 | Rupp et al. |
| 2020/0098869 A1* | 3/2020 | Schulze ............ H01L 29/66068 |
| 2020/0219978 A1* | 7/2020 | Guler .................. H01L 29/0673 |
| 2021/0050421 A1 | 2/2021 | Leendertz et al. |

FOREIGN PATENT DOCUMENTS

| | | | |
|---|---|---|---|
| DE | 102016124973 A1 | 6/2018 | |
| DE | 102017110508 A1 * | 11/2018 | ............. G06F 30/20 |

* cited by examiner

METHOD OF PRODUCING A SILICON CARBIDE DEVICE WITH A TRENCH GATE

TECHNICAL FIELD

The present disclosure is related to a silicon carbide device, in particular, to a silicon carbide switch with transistor cells.

BACKGROUND

Electric circuits for transforming electrical energy, for example in DC/AC converters, AC/AC converters or AC/DC converters and in electric circuits that drive inductive loads, e.g. in motor driver circuits, may include power semiconductor devices as switches. Switching heavy inductive loads may trigger LC oscillations. On the other hand, the dielectric breakdown field strength of silicon carbide (SiC) is high compared to silicon. SiC devices may be significantly thinner than equivalent silicon devices for the same nominal blocking voltage capability and, as a consequence, the on-state resistance of SiC devices may be significantly lower.

There is a need to increase the range of possible applications for silicon carbide devices.

SUMMARY

An embodiment of the present disclosure relates to a silicon carbide device. The silicon carbide device includes a stripe-shaped trench gate structure extending from a first surface into a silicon carbide body. The gate structure has a gate length along a lateral first direction. A bottom surface and a first gate sidewall of the gate structure is connected via a first bottom edge of the gate structure. The silicon carbide device further includes at least one source region of a first conductivity type. A shielding region of a second conductivity type is in contact with the first bottom edge of the gate structure across at least 20% of the gate length.

BRIEF DESCRIPTION OF THE DRAWINGS

The accompanying drawings are included to provide a further understanding of the embodiments and are incorporated in and constitute a part of this specification. The drawings illustrate embodiments of a silicon carbide device and together with the description serve to explain principles of the embodiments. Further embodiments are described in the following detailed description and the claims.

DETAILED DESCRIPTION

Figure 1A:
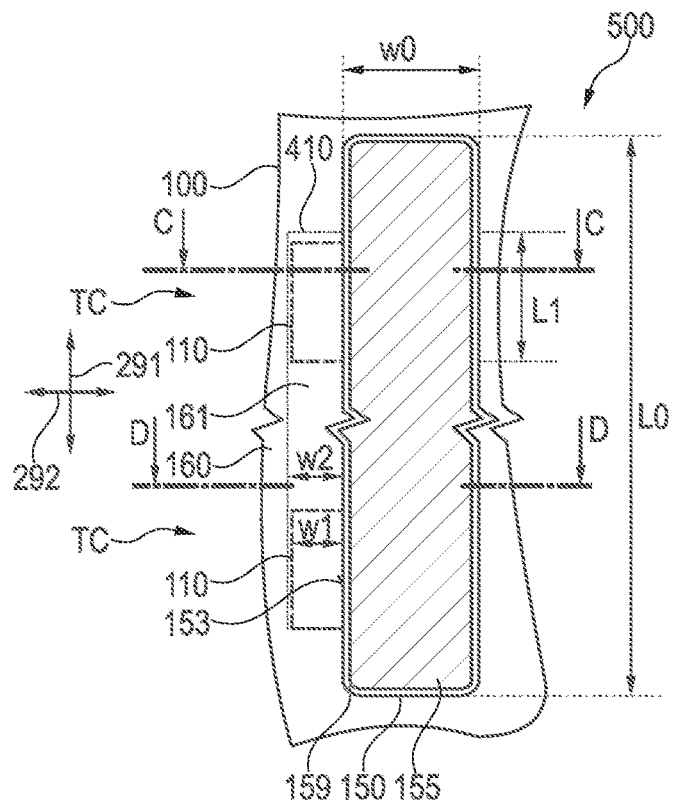
FIGS. 1A-1D illustrate schematic plan and vertical cross-sectional views of a portion of a silicon carbide device with source regions and shielding regions according to embodiments.

In the following detailed description, reference is made to the accompanying drawings, which form a part hereof and in which are shown by way of illustrations specific embodiments in which a silicon carbide device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state. An ohmic contact is a non-rectifying electrical junction with a linear or almost linear current-voltage characteristic.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Two adjoining doping regions of the same conductivity type and with different dopant concentrations form a unipolar junction, e.g., an n/n+ or p/p+ junction along a boundary surface between the two doping regions. At the unipolar junction a dopant concentration profile orthogonal to the unipolar junction may show a step or a turning point, at which the dopant concentration profile changes from being concave to convex, or vice versa.

Ranges given for physical dimensions include the boundary values. For example, a range for a parameter y from a to b reads as a≤y≤b. The same holds for ranges with one boundary value like "at most" and "at least".

Main constituents of a layer or a structure from a chemical compound or alloy are such elements which atoms form the chemical compound or alloy. For example, nickel and silicon are the main constituents of a nickel silicide layer and copper and aluminum are the main constituents of a copper aluminum alloy.

The term "above" is not to be construed as meaning "directly on". Rather, if one element is positioned "above" another element (e.g., a layer is "above" another layer or "above" a substrate), a further component (e.g., a further layer) may be positioned between the two elements (e.g., a further layer may be positioned between a layer and a substrate if the layer is "above" said substrate).

As regards structures and doped regions formed in a silicon carbide body, a second region is "below" a first region if a minimum distance between the second region and a first surface at the front side of the silicon carbide body is greater than a maximum distance between the first region and the first surface. The second region is "directly below" the first region, where the vertical projections of the first and second regions into the first surface overlap. The vertical projection is a projection orthogonal to the first surface.

Regions and/or structures may be laterally separated from each other in the same horizontal layer. Laterally separated regions and/or structures may also be vertically separated (i.e., be positioned in different horizontal layers). In the latter case, orthogonal projections of the separated regions and/or structures into a horizontal projection plane are laterally separated. Regions and/or structures laterally overlap, if orthogonal projections of the concerned regions and/or structures into a horizontal projection plane laterally overlap.

The term "power semiconductor device" refers to semiconductor devices with high voltage blocking capability of at least 30 V, for example 100 V, 600 V, 3.3 kV or more and with a nominal on-state current or forward current of at least 1 A, for example 10 A or more.

According to an embodiment, a silicon carbide device may include a stripe-shaped trench gate structure extending from a first surface into a silicon carbide body.

The silicon carbide body may have two essentially parallel main surfaces of the same shape and size and a lateral surface area connecting the edges of the two main surfaces. For example, the silicon carbide body may be a polygonal (e.g., rectangular or hexagonal) prism with or without rounded edges, or a cylinder. The silicon carbide body may have a surface extension along two horizontal directions and may have a thickness along a vertical direction perpendicular to the horizontal directions. The horizontal directions are also referred to as lateral directions in the following.

The material of the silicon carbide body may be 15R—SiC (silicon carbide of 15R-polytype), or a silicon carbide with hexagonal polytype like 2H—SiC, 4H—SiC or 6H—SiC, by way of example. In addition to the main constituents silicon and carbon, the silicon carbide body may include dopants atoms, for example nitrogen (N), phosphorus (P), beryllium (Be), boron (B), aluminum (Al) and/or gallium (Ga). Further, the silicon carbide body may include unwanted impurities, for example hydrogen, fluorine and/or oxygen.

The stripe-shaped trench gate structure may extend from a first surface at a front side of the silicon carbide body into the silicon carbide body. The gate structure has a gate length along a lateral first direction and a gate width along a lateral second direction, which is orthogonal to the first direction.

The gate structure may include a conductive gate electrode. The gate structure may further include a gate dielectric formed between the gate electrode and the silicon carbide body. Two opposite first and second gate sidewalls may be vertical or may be slightly tilted to the vertical direction. The first and second gate sidewalls may taper or may be parallel.

In general, at least the first gate sidewall may run essentially along a crystal plane of the silicon carbide body in which charge carrier mobility is high (e.g., one of the {11-20} or the {1-100} crystal planes). The first gate sidewall may be an active sidewall, that is to say, a transistor channel may run along the first gate sidewall. In some embodiments, the second gate sidewall may also be an active sidewall (e.g., in the case of parallel first and second gate sidewalls like vertical trench gate structure). In other embodiments, (e.g. in case of a tapering trench gate structure) the second gate sidewall may be an inactive sidewall. Seen from the front side of the silicon carbide body, the first gate sidewall is at a first side of the gate structure and the second gate sidewall is at an opposite second side of the gate structure.

A bottom surface at the bottom of the gate structure connects the first and second gate sidewalls via a first and a second bottom edge. The bottom surface may include a horizontal portion. The first gate sidewall may include a straight section. The first bottom edge may connect a horizontal portion of the bottom surface and a straight section of the first gate sidewall. Accordingly, the second bottom edge may connect a horizontal portion of the bottom surface and a straight section of the second gate sidewall. The first bottom edge between the bottom surface and the first gate sidewall may be sharp-angled or may be rounded and/or beveled (e.g., with a blunt angle). The second bottom edge between the bottom surface and the second gate sidewall may be sharp-angled or may be rounded and/or beveled (e.g., with a blunt angle).

The silicon carbide device may further include at least one source region. The at least one source region may be a doped region of a first conductivity type. The source region may be in contact with the first gate sidewall of the gate structure or may be in contact with a first gate sidewall of a further gate structure. In other words: No source region, one single source region or a plurality of source regions may be formed along the first gate sidewall of the gate structure. In case no source region is formed along the first gate sidewall of the gate structure, at least one source region may be formed along a further gate structure. Source regions formed along the same gate structure may be separated from each other along the first direction. A length of each source region along the first direction may be at least 500 nm, e.g., at least 1 µm.

The silicon carbide device may further include a shielding region. The shielding region may be a doped region of a second conductivity type. The first conductivity type and the second conductivity type are complementary conductivity types. The first conductivity type may be n-type and the second conductivity type may be p-type. Alternatively, the first conductivity type may be p-type and the second conductivity type may be n-type.

The shielding region is in contact with the first bottom edge across at least 20% of the gate length of the gate structure. For example, the shielding region may extend along the complete length of the gate structure. The shielding region may at least partially extend along the first gate sidewall. According to other examples, the shielding region extends across at least 20% of the first gate sidewall. Along the first bottom edge, the shielding region may be absent at least in sections vertically below the source regions. Where the shielding region is in contact with the first bottom edge, the shielding region may vertically extend along the first gate sidewall from the first surface to the first bottom edge.

According to another example, the shielding region may extend across at least 30% of the distance between neighboring source regions.

The shielding region may further be in contact with the second gate sidewall, with the second bottom edge and/or the bottom surface of the gate structure. The shielding region may be in contact with the second gate sidewall and the second bottom edge across the complete gate length of the gate structure. The shielding region may be in contact with a fully-shielded section of the bottom surface along the second bottom edge across the complete gate length of the gate structure. The shielding region may be in contact with a partly-shielded section of the bottom surface along the first bottom edge in sections between neighboring source regions.

With the shielding region in contact with a significant section of the first bottom edge, a significant portion of the gate structure may be embedded completely in the shielding region. Since the shielding region may shield the gate structure against a potential applied to a rear side potential, e.g., the drain potential, an increased portion of the shielding region along the first gate sidewall may reduce a gate-to-drain capacitance $C_{GD}$. The shielding region may be electrically connected to a front side potential, e.g., the source potential. In this case, an increased portion of the shielding portion in relation to the source regions may increase a gate-to-source capacitance $C_{GS}$. Increased $C_{GS}$ and reduced $C_{GD}$ significantly reduce turn-off oscillation tendency.

The greater portion of the shielding region along the first surface may provide a larger contact area between the shielding region and a front side electrode formed on the first surface. The larger contact area may reduce on ohmic contact resistance between the front side electrode and the shielding region. In addition, the larger area portion of the shielding region along the first surface may further simplify the formation of reliable, low-resistance ohmic contacts between the shielding region and the front side electrode. As a result, the surge-current ruggedness of a body diode, which the shielding region forms with a drift structure, may be significantly improved. The larger contact area and the reduced ohmic resistance of the contact between the front side electrode and the shielding portion may also contribute to reducing current overshoot during turn-on, reducing body diode losses and/or in reducing the turn-off oscillation tendency.

Formation of the shielding region along the first gate sidewall may reduce the area portion of the source regions and, as a consequence, a total transistor channel width. The reduced transistor channel width in combination with the improved shielding of the transistor channel from such portions of the shielding region, which are formed between the source regions along the first direction, may contribute to decreasing the transistor saturation current and thus may improve short-circuit robustness. In addition, the completely shielded portion of the bottom surface is increased and the not-completely shielded portion of the bottom surface can be shielded effectively from all four lateral sides. Both effects may further contribute to increasing gate dielectric reliability.

Since in high voltage devices, for example in devices with a voltage blocking capability of at least 600 V, for example at least 3 kV, the resistance of a voltage sustaining layer dominates the on-state losses, it is possible that a possibly slightly increased on-state resistance of the transistor channel may be negligible. On the other hand, the formation of the shielding region along a significant portion of the first gate sidewall may significantly soften switching behavior, may improve body diode characteristics and/or may increase short-circuit ruggedness. In particular, high voltage devices with a voltage blocking capability of at least 600 V, for example at least 3 kV, may benefit from a shielding region extending across a significant portion of the first gate sidewall.

According to an embodiment, the shielding region may be in contact with the first bottom edge across at least 30%, for example at least 50%, of the gate length. The greater portion of the shielding region may further reduce $C_{GD}$, may further increase Ccs and/or may further improve device reliability.

According to an embodiment, the shielding region may include a top shielding portion and a deep shielding portion. The top shielding portion is located between the first surface and the deep shielding portion. The top shielding portion may adjoin (e.g., directly adjoin) the first surface. A vertical extension of the top shielding portion may be greater than a vertical extension of the gate structure. The top shielding portion may be in contact with the first bottom edge, e.g. at least in places.

The top shielding portion may be in contact with the second bottom edge of the gate structure along the complete length of the gate structure. The deep shielding portion may be formed in a layer of the silicon carbide body between the bottom surface of the gate structure and a second surface at the rear side of the silicon carbide body.

A horizontal cross-sectional area of the deep shielding portion may be the same or essentially the same as the horizontal cross-section of the top shielding portion, wherein the same implant mask may be used for forming the deep shielding portion and the top shielding portion. Alternatively, the horizontal cross-sectional areas or the top shielding portion and the deep shielding portion may be considerably different. In the latter case, different implant masks may define the deep shielding portion and the top shielding portion.

The top shielding portion and the deep shielding portion may be directly connected to each other along the vertical direction. The top shielding portion and the deep shielding portion may overlap with each other in the sense that one or more end-of-range peaks of implants defining the deep shielding portion may be located within the top shielding portion. The deep shielding portion may be continuous along the vertical direction.

The deep shielding portion may improve the shielding effect on the transistor channel and on such portions of the gate dielectric that are not directly embedded in the shielding region. The improved shielding of the transistor channel may reduce DIBL (drain induced barrier lowering).

The improved lateral shielding effect may facilitate sufficient shielding even at comparatively low vertical extension of the shielding region, e.g. the deep shielding portion. For example, the improved lateral shielding may compensate at least partly a reduction of the vertical extension of the deep shielding portion by omitting implant(s) with implant energy greater than 1.3 MeV. For example, a vertical distance between the gate bottom surface and a lower edge of the deep shielding portion may be reduced to at least 50 nm, e.g. at least 300 nm.

According to an embodiment, a first distance between the top shielding portions and the first gate sidewall may be smaller than a second distance between the deep shielding portions and the first gate sidewall. For example, a surface section of the top shielding portion may directly adjoin the source region. The deep shielding portion may have a lateral distance to the source regions along at least one lateral direction and/or may laterally overlap with the source region along at least one lateral direction.

According to an embodiment, the top shielding portion may include separation sections. The separation sections may be in contact with the first gate sidewall. The separation sections may extend from the first surface down to the first bottom edge. The separation sections may laterally separate source regions that are formed along the first direction along the gate structure. In this case, the top shielding portion may shield each transistor channel from all four lateral sides.

According to an embodiment, the top shielding portion may include separation sections. The separation sections may be located between the source regions. For example, the separation sections may be in contact with the first gate sidewall. Along the first surface, the separation sections and the source regions may cover a continuous part of the first gate sidewall of the gate structure along the first direction. The separation sections and the source regions may entirely cover the first gate sidewall along the first surface.

The separation sections and the source regions may have the same width along the second direction. Along the first surface, the separation sections of the top shielding portion and the source regions may complement each other to a first contiguous area without gaps. The absence of further doped regions along the first gate sidewall or in the vicinity of the first gate sidewall may facilitate forming the top shielding portion and the source regions by using comparatively simple photomasks.

According to an embodiment, the silicon carbide device may include a first gate structure and a neighboring second gate structure. Each of the first gate structure and the second gate structure may be embodied as the afore-mentioned gate structure. The first gate structure or the second gate structure may even correspond to the afore-mentioned gate structure.

The top shielding portion and the source regions assigned to the first gate structure may be arranged between the first gate sidewall of the first gate structure and the second gate sidewall of the second gate structure.

In particular, it is possible that no further doped region, which has the conductivity type of the source region and which is electrically connected through an ohmic path with the voltage sustaining layer, adjoins the first surface in the area between the first gate structure and the second gate structure.

At the first surface, an area between the first gate sidewall and the second gate sidewall may be filled with the top shielding portion and the source regions. In particular, the area between the first gate structure and the second gate structure may be entirely filled with the exposed surfaces of the shielding portion and the source region.

In other words, between the first gate sidewall of the first gate structure and the second gate sidewall of the second gate structure, the top shielding portion and the source regions may complement each other along the first surface to a second contiguous area. The second contiguous area includes the first contiguous area and a further stripe-shaped portion of the top surface of the top shielding portion in the first surface. The absence of further doped regions between neighboring gate structures may further simplify formation of the top shielding portion and the source regions.

According to an embodiment, along the first direction a lateral dopant profile through a transition between one of the separation sections and one of the source regions may include a plateau section. The plateau section may reflect that along the first direction the openings in an implant mask for the source region implant can be narrower than the length of the mask columns of an implant mask for the top shielding portion implant. The length of the plateau sections corresponds to the difference between the extension of the mask columns for the top shielding portion implant and the extension of the mask openings for the source region implant along the first direction. The length of each plateau section may be at least 50 nm, 200 nm or even 500 nm. For example, in the plateau section the dopant concentration may change by not more than one order of magnitude across a distance of 50 nm or 200 nm or even 500 nm. In the plateau section, the conductivity type may be the conductivity type of the separation section or the conductivity type of the source region, or intrinsic. The plateau section may simplify the alignment of implant masks for the formation of the source regions and/or separation sections.

According to an embodiment, the silicon carbide device may include a first gate structure and a neighboring second gate structure. The first gate structure and the second gate structure may be embodied as the afore-mentioned gate structure. The first gate structure or the second gate structure may even correspond to afore-mentioned gate structure.

The deep shielding portion may include a deep section. Along the second direction, the deep section may be laterally separated from the first gate sidewall of the first gate structure. Further, each deep section may laterally overlap with the second gate sidewall of the second gate structure.

For example, the silicon carbide device may include a plurality of gate structures. The deep shielding portion may include a plurality of deep sections separated from each other at least along the second direction. Along the second direction, each deep section may be laterally separated from the first gate sidewall of a first one of two neighboring gate structures and may laterally overlap the second gate sidewall of a second one of the two neighboring gate structures.

According to an embodiment, the deep section may form a contiguous stripe with a longitudinal axis parallel to the first direction. The deep section may extend across at least 90% of the gate length or across the complete gate length.

For example, the silicon carbide device may include a plurality of gate structures and a plurality of deep sections. The deep sections may be laterally separated along the second direction. The deep sections may form contiguous stripes with longitudinal axes parallel to the first direction. For example, each deep section may extend across at least 90% of the gate length or across the complete gate length. With stripe-shaped deep sections, it may be possible that forming the deep sections gets along without fine adjustment of a photomask along the first direction. Each stripe-shaped deep section may contribute to shielding transistor channels formed on opposite longitudinal sides of the stripe-shaped deep sections.

According to another example, the deep section may include a plurality of deep sub-sections. The deep sub-sections may be laterally separated along the first direction. The deep sub-sections may be arranged matrix-like in lines and rows, wherein the rows may run orthogonal to the lines. Two of the deep sub-sections are formed on opposite sides of each source region along the second direction. In this way, each transistor channel may be shielded by at least two deep sub-sections formed on opposite lateral sides.

In case the source regions assigned to neighboring gate structures are shifted to each other, e.g. by half of the center-to-center distance between neighboring source regions, each transistor channel may be shielded by four deep sub-sections formed on four opposite lateral sides. The deep sub-sections may be absent in regions where a shielding region has only small or negligible shielding effect. With matrix-like arranged deep sections it may be possible to maintain a high lateral spreading of the on-state current. Matrix-like arranged deep sub-sections may keep small possible adverse effects of the deep sub-sections on other electric characteristics of the silicon carbide device, e.g. the on-state resistance.

According to another embodiment, a horizontal cross-section of the deep shielding portion may include a grid with grid openings. Each grid opening may laterally enclose at least a portion of one source region. For example, each grid opening may laterally enclose one complete source region. According to another example, each grid opening may enclose a channel sidewall section. For example, a horizontal cross-section of the deep shielding portion may be more or less identical with the horizontal cross-section of the top shielding portion below a plurality of gate trenches and may be formed by using the same implantation mask. The grid-shaped deep shielding portion may facilitate a high shielding effect.

According to another embodiment, the silicon carbide device may include a first gate structure and a neighboring second gate structure. The first gate structure and the second gate structure may be embodied as the afore-mentioned gate structure. The first gate structure or the second gate structure may even correspond to afore-mentioned gate structure.

The shielding region may be in contact with the first bottom edge across the gate length of the first gate structure. It is possible that an alignment of the shielding region along the first direction is not required. The manufacturing process may thus be highly effective.

According to an embodiment, the source region may extend along the gate length of the second gate structure. It is possible that an alignment of the source region along the first direction is not required. The manufacturing process may thus be highly effective.

According to another embodiment, the silicon carbide device may include a body region of the second conductivity type and a current spread region of the first conductivity type. The body region and the current spread region may be formed in the silicon carbide body. The body region may separate the source region and the current spread region.

In the on-state of the silicon carbide device, a transistor channel may be formed in the body region. The transistor channel may be an inversion layer formed along the gate structure. The inversion layer facilitates a unipolar charge carrier flow between the source region and the current spread region in the on-state.

According to another embodiment, the silicon carbide device may include a drift structure between the gate structures and the second surface of the silicon carbide body. The drift structure may include a voltage sustaining structure. The voltage sustaining structure may include a lightly doped drift zone with a vertical extension of at least 4 µm, 12 µm, 20 µm or even at least 100 µm. The minimum vertical extension may depend on the desired blocking capability of the silicon carbide device. For example, for a desired blocking capability of 650V (or 1.2k V or 1.7 V or 3.3 kV or 6.5 kV) the vertical extension of the drift zone may be at least 4 µm (or at least 8 µm or at least 12 µm or at least 20 µm or at least 40 µm, respectively). Alternatively or in addition, the voltage sustaining structure may include a compensation structure, e.g. a superjunction structure.

The shielding region and the drift structure may form a pn junction. The pn junction may be effective as body diode or as part of a body diode, which is in the forward conducting mode when the silicon carbide device is reverse-biased. The large contact area for the shielding region along the first surface may facilitate a low ohmic contact between the shielding region and a front side electrode and may improve the electric characteristics of the body diode.

FIGS. 1A-1D show a portion of a silicon carbide device 500 with a silicon carbide body 100. The silicon carbide device 500 may be or may include an IGFET (insulated gate field effect transistor), for example an MOSFET (metal oxide semiconductor FET), or an MCD (MOS controlled diode) or an IGBT (insulated gate bipolar transistor), by way of example.

The silicon carbide body 100 may include or consist of single crystalline silicon carbide, e.g., a silicon carbide crystal including the main constituents silicon and carbon. The silicon carbide crystal may include unwanted impurities like hydrogen, and/or oxygen and/or intended impurities, e.g., dopant atoms. The polytype of the silicon carbide crystal may be 15R or may be hexagonal, e.g. 2H, 6H, or 4H. The silicon carbide body 100 may include or consist of a silicon carbide layer grown by epitaxy.

A first surface 101 at a front side of the silicon carbide body 100 may be planar or ribbed. A mean plane of the first surface 101 extends along horizontal directions. The mean plane of a planar first surface 101 is identical with the planar first surface 101. In case of a non-planar first surface 101, for example in case of a ribbed first surface 101, the mean plane may be a planar least squares plane. Position and orientation of the planar least squares plane are defined such that the sum of the squares of the deviations of surface points of the ribbed first surface 101 from the planar least squares plane has a minimum. A vertical direction 104 is orthogonal to the horizontal directions, e.g. parallel to the surface normal onto the mean plane. The horizontal directions are also referred to as lateral directions in the following.

The vertical direction 104 may coincide with a main lattice direction or may be tilted to a main lattice direction by an off-axis angle, wherein the off-axis angle may be in a range from 2° to 8°, in particular 4°. At the rear side of the silicon carbide body 100, a second surface may extend parallel to a planar first surface 101 or parallel to the least squares plane of a ribbed first surface 101.

Transistor cells TC are formed at the front side of the silicon carbide body 100. A drift structure 130 laterally extends through the silicon carbide body 100 between the transistor cells TC and the second surface. The drift structure 130 may include a voltage sustaining structure, e.g., a lightly doped drift zone and/or a compensation structure, e.g. a superjunction structure.

Each transistor cell TC includes a source region 110 of a first conductivity type and a body region 120 of a second conductivity type. The body region 120 and the drift structure 130 form a first pn junction pn1. The body region 120 and the source region 110 form a second pn junction pn2. A vertical extension of the body region 120 corresponds to a channel length of the transistor cells TC and may be in a range from 0.2 µm to 1.5 µm.

Stripe-shaped trench gate structures 150 extend along a lateral first direction 291. At least one gate structure 150 is in contact with the source regions 110 and the body regions 120 of the transistor cells TC. The gate structures 150 include a conductive gate electrode 155 that may include or consist of a heavily doped polycrystalline silicon layer and/or a metal-containing layer. A gate dielectric 159 separates the gate electrode 155 from the silicon carbide body 100 along at least one side of the gate structure 150. The gate dielectric 159 may include or consist of thermally grown or deposited silicon oxide, silicon nitride, silicon oxynitride, another deposited dielectric material or any combination thereof. A thickness of the gate dielectric 159 may be selected to obtain transistor cells TC with a threshold voltage in a range from 1.0 V to 8 V. The gate structures 150 may exclusively include the gate electrode 155 and the gate dielectric 159 or may include further conductive and/or dielectric structures in addition to the gate electrode 155 and the gate dielectric 159.

The gate structures 150 may be equally spaced and/or may have a uniform gate width w0. A center-to-center distance between neighboring gate structures 150 may be in a range from 0.5 μm to μm, e.g., from 1 μm to 5 μm. A gate length L0 of the gate structures 150 may be up to several millimeters. A vertical gate extension v0 of the gate structures 150 may be in a range from μm to 5 μm, e.g., in a range from 0.5 μm to 2 μm.

Opposing first and second gate sidewalls 151, 152 of each of the gate structures 150 may run essentially along the vertical direction 104 or may be tilted with respect to the vertical direction 104 by a tilt angle. In the latter case, the gate structures 150 may have parallel first and second gate sidewalls 151, 152 or the gate structures 150 may taper with increasing distance to the first surface 101. The tilt angle between the gate sidewalls 151, 152 and the vertical direction 104 may be chosen according to the alignment of the crystal axes and/or according to the off-axis angle.

For example, the absolute value of the tilt angle between the first gate sidewall 151 and the vertical direction 104 may deviate from the absolute value of the off-axis angle by not more than ±1° (e.g. in the case of 4H—SiC, the tilt angle may range from at least 3° to at most 5°). The tilt angle may, however, deviate from the off-axis angle in orientation. The tilt angle between the second gate sidewall 152, which is opposite to the first gate sidewall 151, and the vertical direction 104 may be oriented equal to or opposite to the tilt angle of the first gate sidewall 151. The larger the tilt angle, the narrower a tapering gate structure 150 becomes starting from the first surface 101.

In general, at least the first gate sidewall 151 may run essentially along a crystal plane of the silicon carbide body 100 in which charge carrier mobility is high (e.g., one of the {11-20} or the {1-100} crystal planes). The first gate sidewall 151 may be an active sidewall, that is to say, the transistor channel may run along the first gate sidewall 151. In some embodiments, the second gate sidewall 152 may also be an active sidewall (e.g., in the case of a vertical trench gate structure 150). In other embodiments, (e.g. in case of a tapering trench gate structure 150) the second gate sidewall 152 may be an inactive sidewall.

A bottom surface 158 at the bottom of the gate structures 150 connects the first and second gate sidewalls 151, 152 or forms at least part of a connection between the first gate sidewall 151 and the second gate sidewall 152. The bottom surface 158 may include a horizontal portion. The bottom surface 158 and the first gate sidewall 151 of each gate structure 151 may be connected via a first bottom edge 156. The bottom surface 158 and the second gate sidewall 152 of each gate structure 150 may be connected via a second bottom edge 157. The first bottom edge 156 may be sharp-angled or may be rounded and/or beveled. The second bottom edge 157 may be sharp-angled or may be rounded and/or beveled.

In FIG. 1A a plurality of isolated source regions 110 are formed in a portion of the silicon carbide body 100 between two neighboring gate structures 150. A lateral length L1 of the source regions 110 along the first direction 291 may be at least 500 nm, e.g., at least 1 μm.

Separation sections 161 of the shielding regions 160 may laterally separate neighboring source regions 110 at the first surface 101 along the first direction 291. A lateral width w2 of the separation sections 161 and a lateral width w1 of the source regions 110 may be equal. The separation sections 161 and the source regions 110 formed between the same two gate structures 150 may complement each other to a first contiguous area 410 in the plane of the first surface 101. The first contiguous area 410 does not include a gap.

Figure 1B:
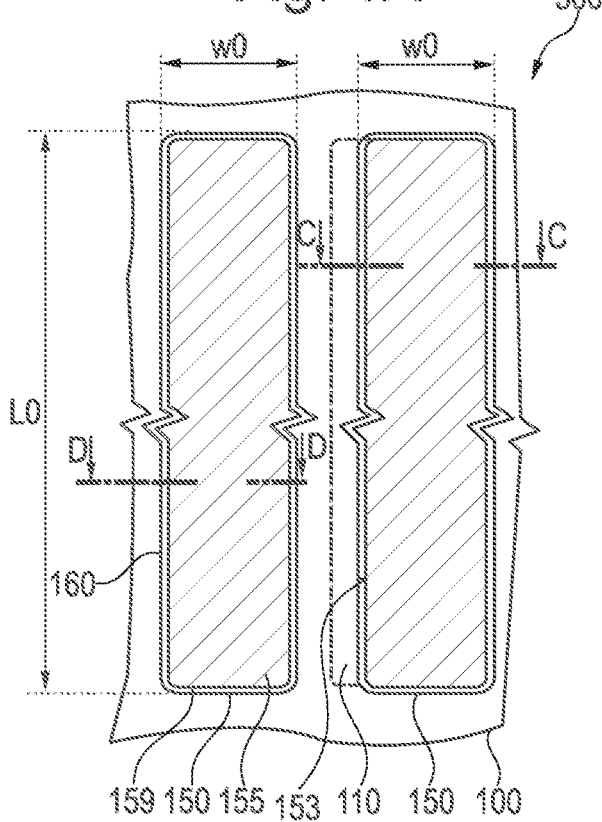

FIG. 1B shows one single source region 110 formed between two neighboring gate structures 150. The source region 110 may extend without any interruption along the complete gate length L0. In other words, the source region 110 may extend from one longitudinal end of the gate structure 150 to the opposite longitudinal end. Along another gate structure 150 without source region 110, the shielding region 160 may extend without any interruption along the complete gate length L0.

The shielding region 160 may extend along one or more further gate structures 150 from one longitudinal end of the concerned gate structure 150 to the opposite longitudinal end.

Channel sidewall sections 153 of the first gate sidewalls 151 extend from the source regions 110 down to the first bottom edges 156.

Figure 1C:
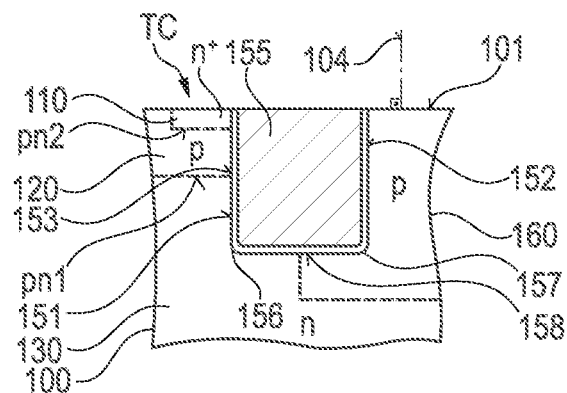
Figure 1D:
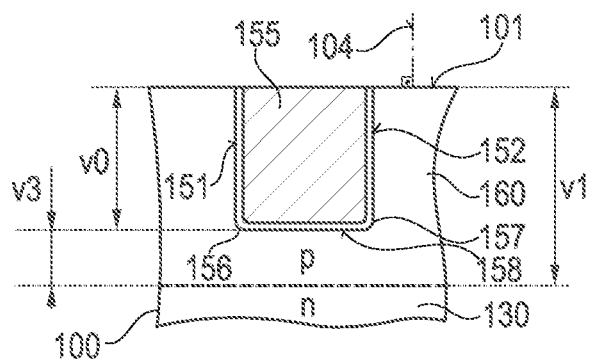
Figure 2A:
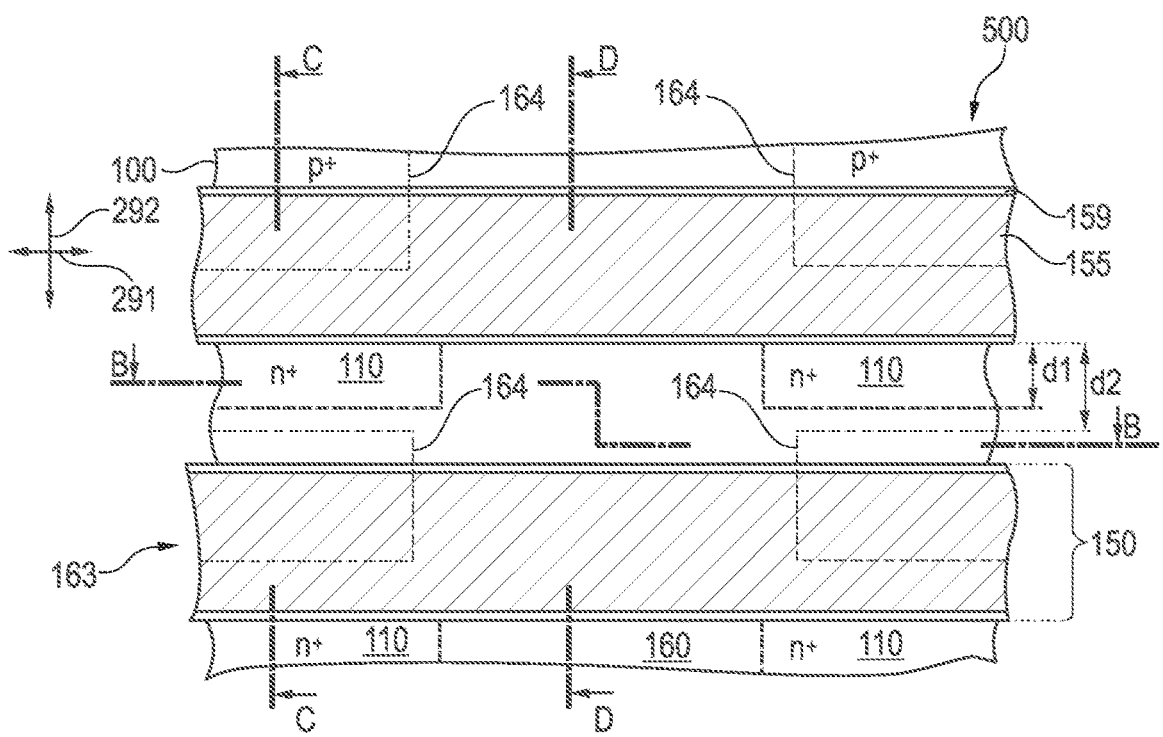
FIGS. 2A-2D illustrate schematic plan and vertical cross-sectional views of a portion of a silicon carbide device according to an embodiment with a shielding region including deep sub-sections arranged in a matrix.
Figure 2B:
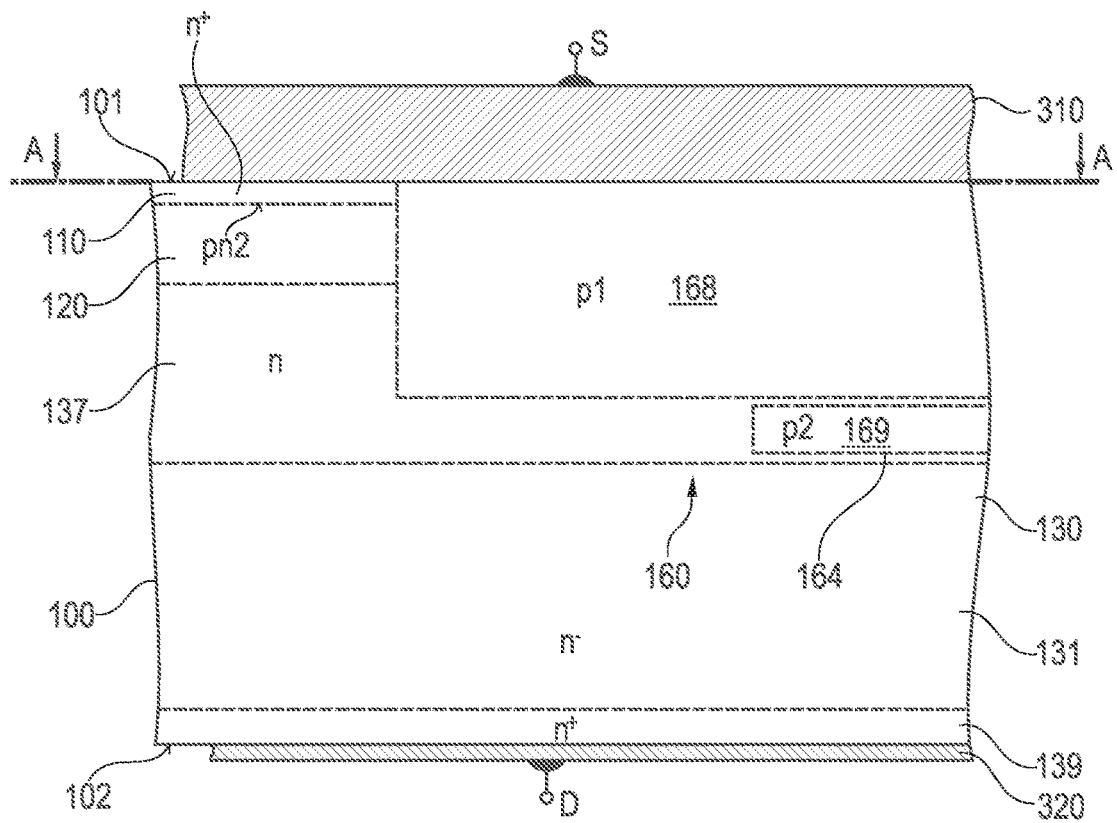
Figure 2C:
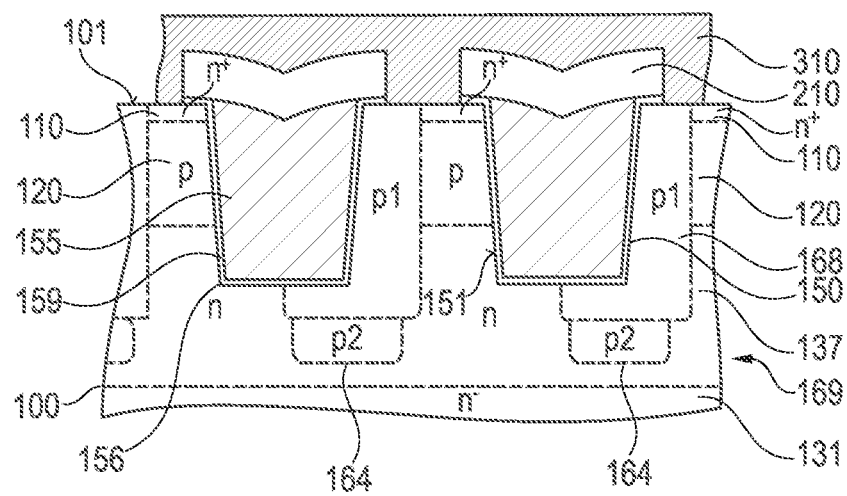
Figure 2D:
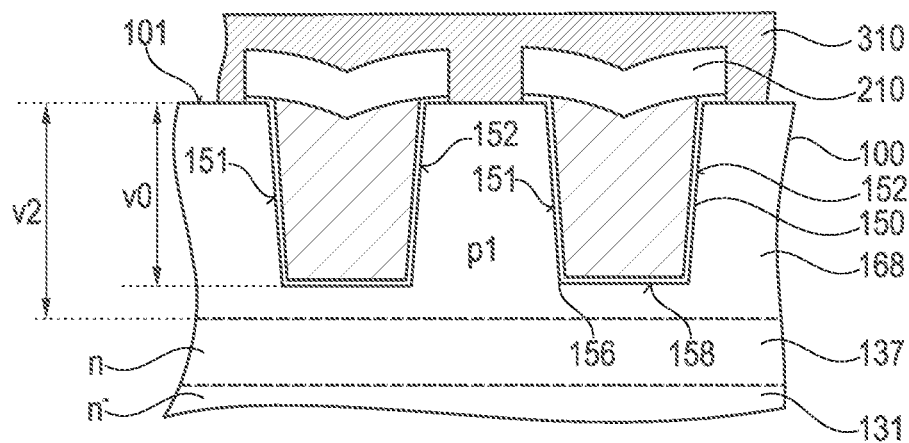
Figure 3A:
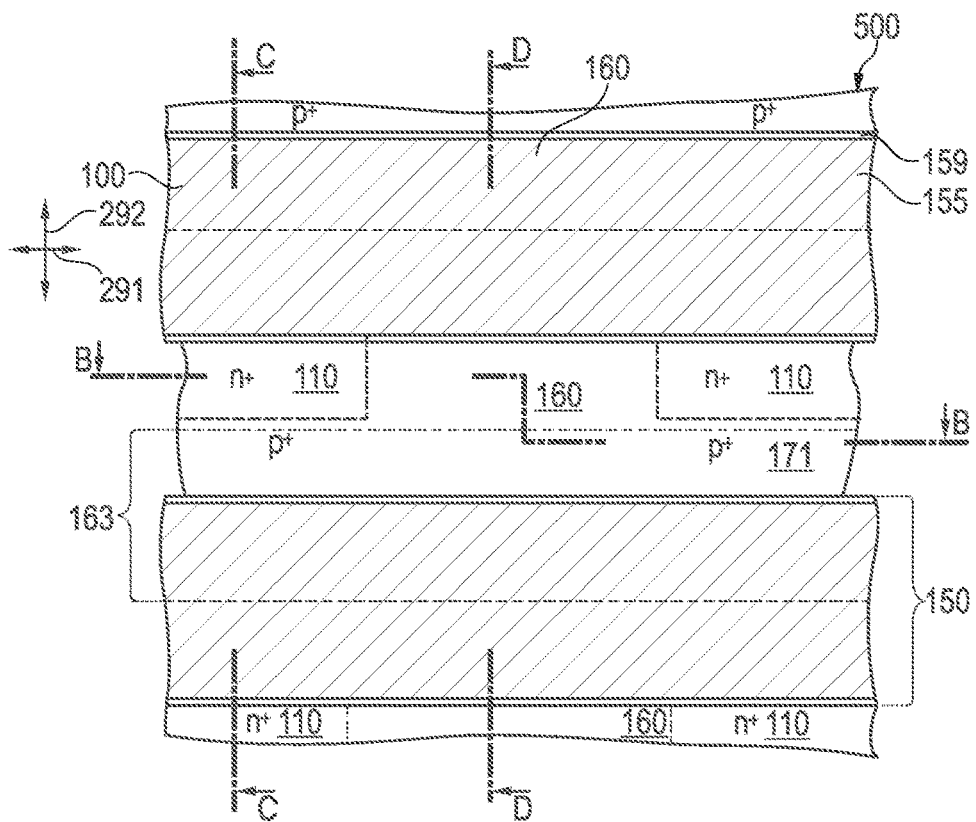
FIGS. 3A-3D illustrate schematic plan and vertical cross-sectional views of a portion of a silicon carbide device according to an embodiment with a shielding region including stripe-shaped deep sections.
Figure 3B:
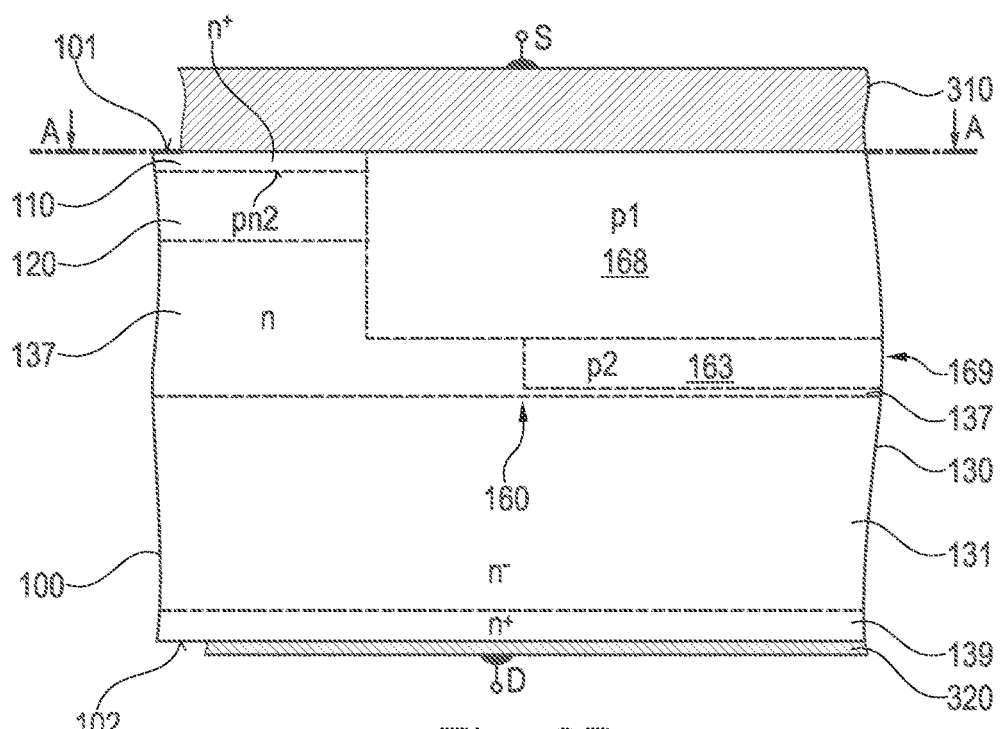
Figure 3C:
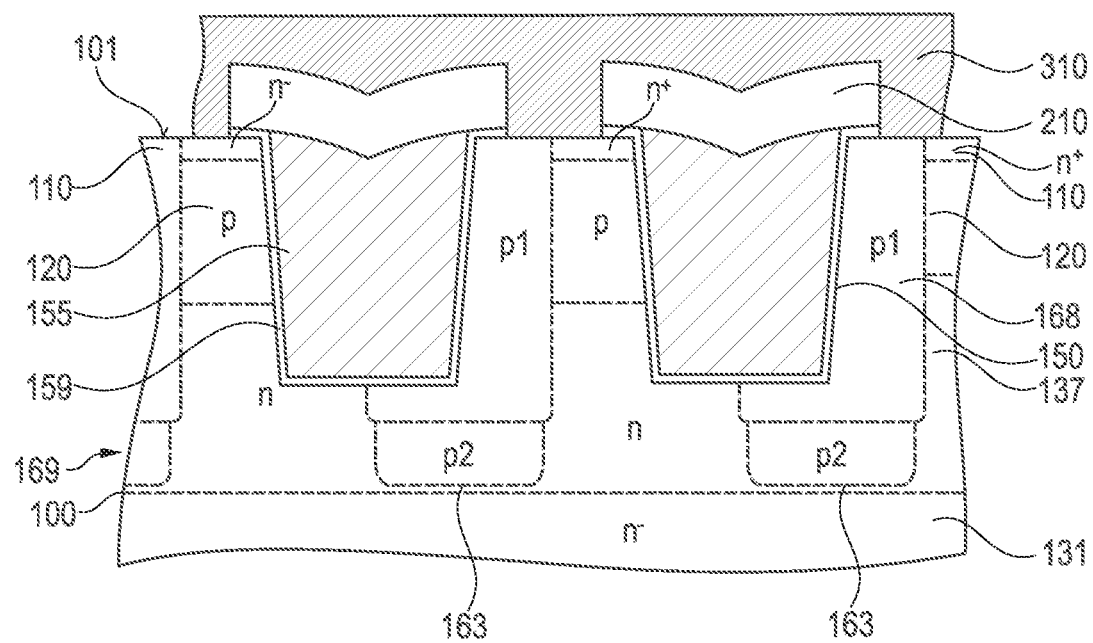
Figure 3D:
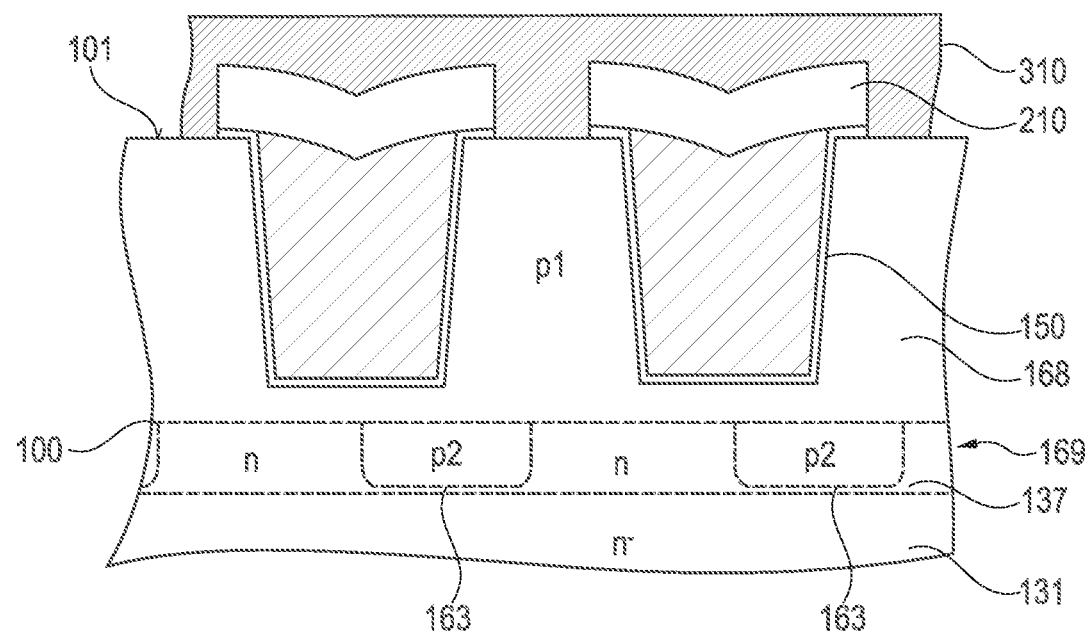
Figure 4A:
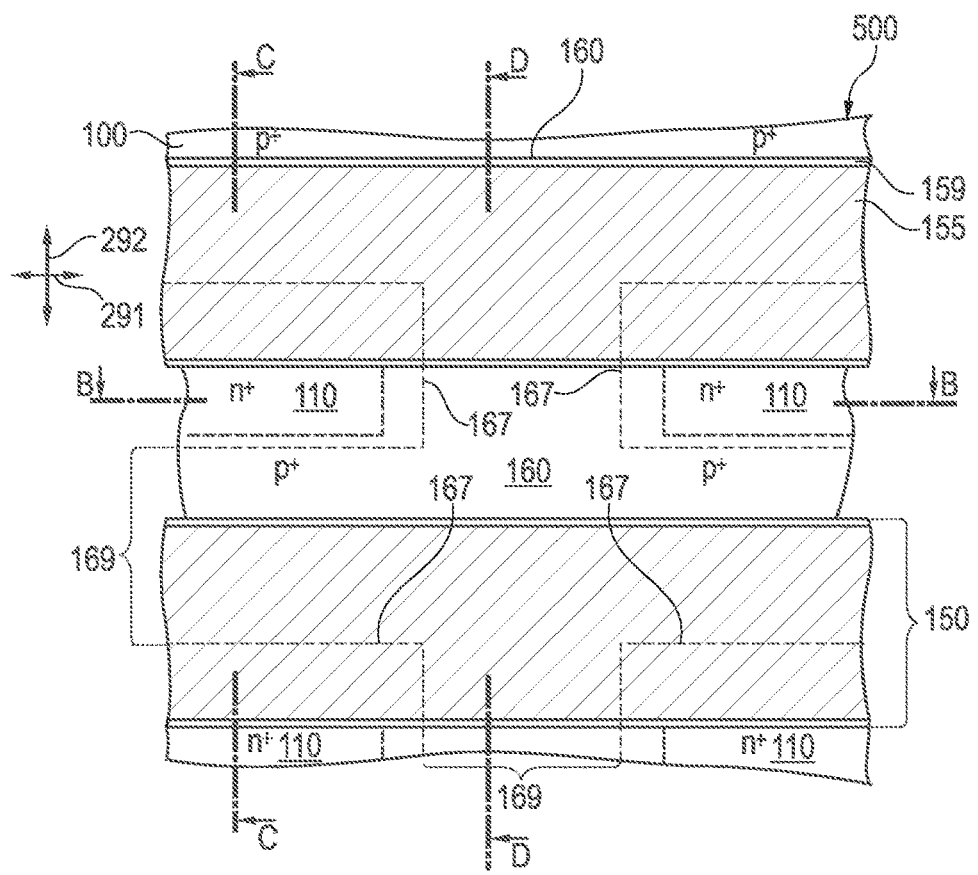
FIGS. 4A-4D illustrate schematic plan and vertical cross-sectional views of a portion of a silicon carbide device according to an embodiment with a shielding region including a grid-shaped deep section.
Figure 4B:
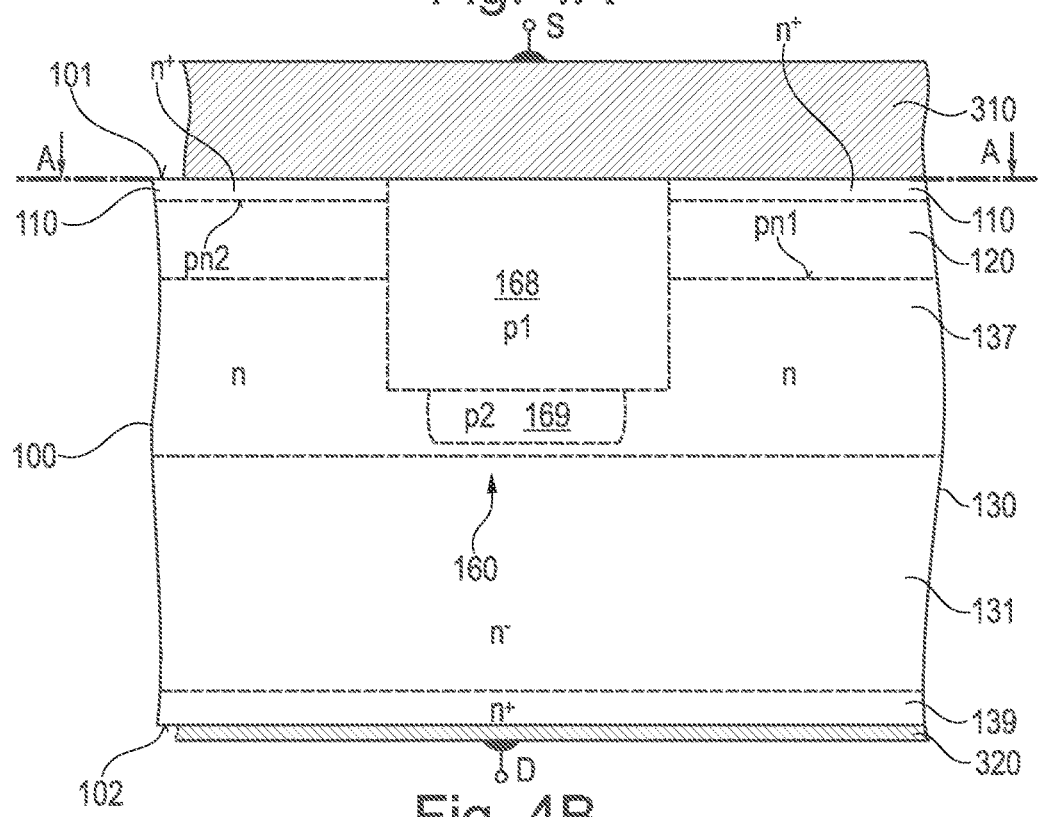
Figure 4C:
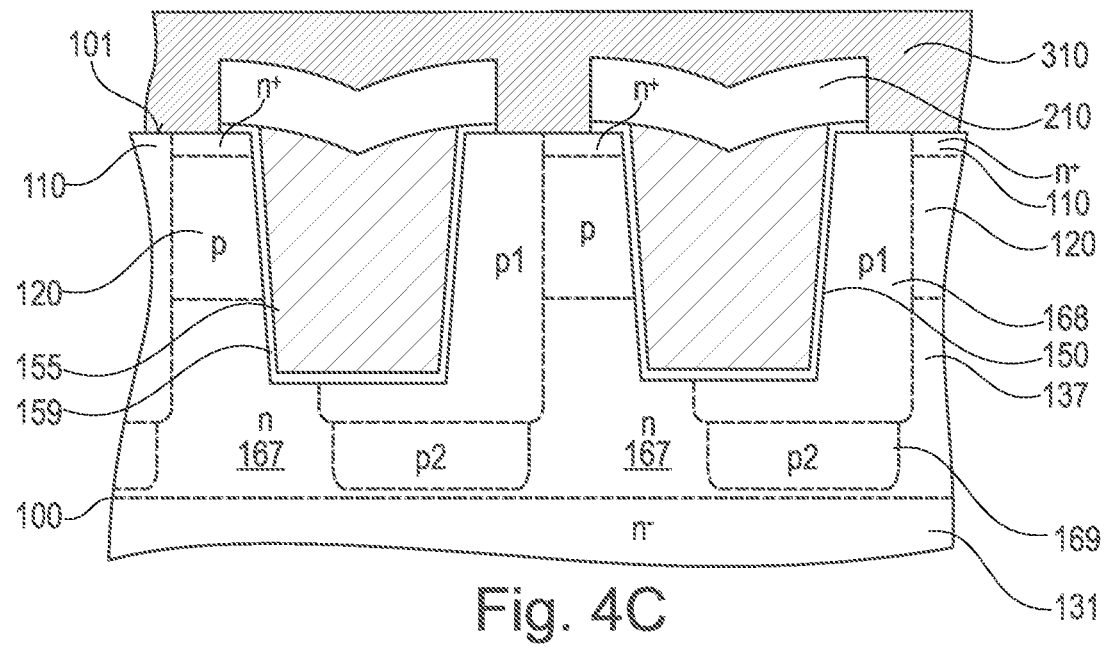
Figure 4D:
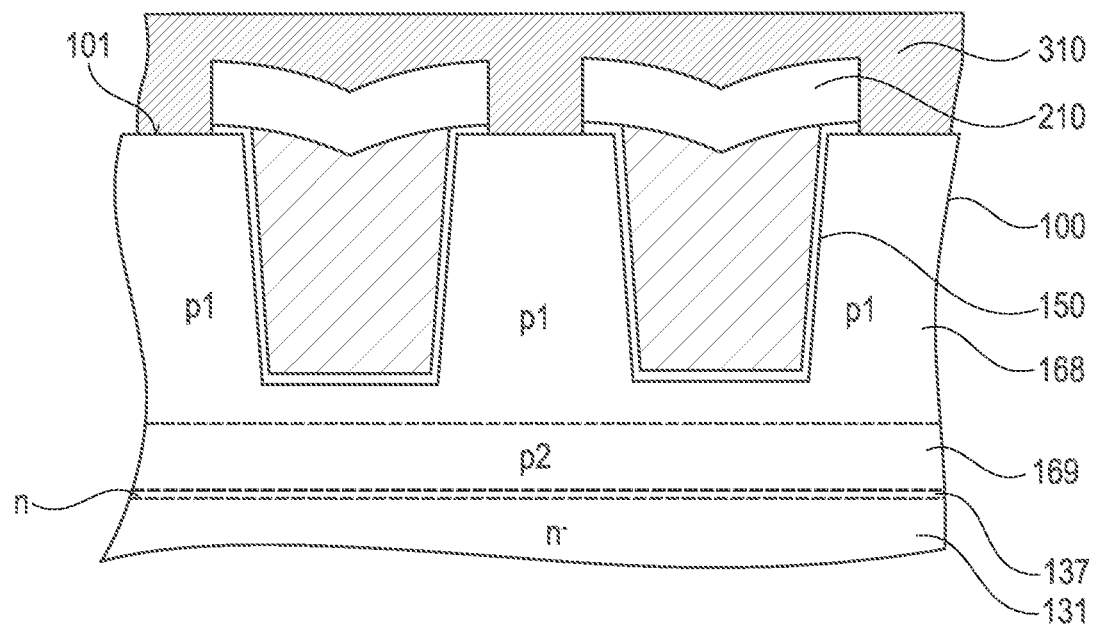

The shielding region 160 extends from the first surface 101 into the silicon carbide body 100 as illustrated in FIGS. 1C and 1D. The shielding region 160 may be in direct contact with the inactive second gate sidewalls 152 across the gate length L0 and across the vertical gate extension v0. Along the second gate sidewalls 152, the shielding region 160 extends from the first surface 101 down to below the gate structure 150. A first vertical extension v1 of the shielding regions 160 is greater than the vertical gate extension v0. For example, a vertical distance v3 between the gate bottom surface 158 and a lower edge of the shielding region 160 may be at least 50 nm, e.g. at least 300 nm.

The shielding region 160 includes sections between the body regions 120 and the inactive second gate sidewalls 152. The body regions 120 and the shielding region 160 may form unipolar junctions. The shielding region 160 may include the separation sections 161 separating neighboring source regions 120 along the first direction 291. The separation sections 161 are in direct contact with the first gate sidewalls 151 outside the channel sidewall sections 153.

A maximum dopant concentration in the shielding region 160 may be higher than a maximum dopant concentration in the body region 120. A vertical dopant concentration profile in the shielding region 160 may have a local maximum at a position below the gate structure 150. Along the second gate sidewall 152 a dopant concentration in the shielding region 160 may be higher, i.e., at least ten times as high as a dopant concentration in the body region 120 along the first gate sidewalls 151.

In FIGS. 2A-2D the shielding region 160 includes a top shielding portion 168 and a deep shielding portion 169. The deep shielding portion 169 and the top shielding portion 168 are connected with each other along the vertical direction 104.

A vertical extension v2 of the top shielding portion 168 is greater than the vertical gate extension v0. The deep shielding portion 169 includes a plurality of deep sub-sections 164 arranged along parallel lines and parallel rows, wherein the rows run orthogonal to the lines. Along the horizontal second direction 292, each deep sub-section 164 is formed between two neighboring source regions 110. The deep sub-sections 164 may be laterally separated from the source regions 110. Along the horizontal first direction 291, neighboring deep sub-sections 164 of the same row are laterally separated. A horizontal length of the deep sub-sections 164 along the first direction 291 may be equal to, smaller than, or greater than a length of the source regions 110 along the first direction 291.

For example, the top shielding portion 168 may improve the lateral shielding of the gate dielectric and the transistor channel to a degree such that it is possible to symmetrically withdraw the deep sub-sections 164 along the first direction 291 with reference to the edges of the source regions 110 as illustrated. In this case, the horizontal length of the deep sub-sections 164 is smaller than the length of the source regions 110.

A first distance d1 between the top shielding portions and the first gate sidewalls 151 may be smaller than a second distance d2 between the deep shielding portions 168 and the first gate sidewalls 151.

The drift structure 130 may include a drift zone 131 of the first conductivity type. The drift zone 131 forms a voltage sustaining structure, wherein a vertical extension and a dopant concentration in the drift zone 131 may be selected such that the silicon carbide device 500 provides a nominal blocking voltage capability in an off state of the silicon carbide device 500. The drift zone 131 may be formed in a layer grown by epitaxy. A mean net dopant concentration in the drift zone 131 may be, for example, in a range from 1E15 cm$^{-3}$ to 5E16 cm$^{-3}$. According to another example, the drift structure 130 may include a compensation structure, e.g. a superjunction structure.

A heavily doped contact portion 139 may be formed between the drift structure 130 and a rear side electrode that directly adjoins the second surface 102 of the silicon carbide body 100. The heavily doped contact portion 139 and the rear side electrode form a low-resistive ohmic contact. The contact portion 139 may have the same conductivity type as the drift zone 131, the opposite conductivity type, or may include zones of both conductivity types.

The drift structure 130 may include current spread regions 137. The current spread regions 137 may be formed between the body regions 120 and the voltage sustaining structure, e.g., the drift zone 131. The current spread regions 137 may be in contact with the body regions 120. The current spread regions 137 may laterally separate neighboring deep sub-sections 164. Portions of the current spread regions 137 may be formed directly below the deep shielding portions 169. The current spread regions 137 have a higher mean dopant concentration than the drift zone 131 and may facilitate a better lateral spreading of the on-state current.

Implant masks defining the deep sub-sections 164 and/or the source regions 110 may have rounded openings, e.g., oval or circular openings. Accordingly, the horizontal cross-sectional areas of the deep sub-sections 164 and/or the source regions 110 may include circular segments, oval segments, circles and/or ovals. An implant mask defining the top shielding portion 168 may include rounded columns, e.g., oval or circular columns. Accordingly, the horizontal cross-sectional areas of openings in the top shielding portion 168 may be circular segments, oval segments, circles and/or ovals.

A first load electrode 310 at the front side of the silicon carbide body 100 is electrically connected with the source regions 110, the body regions 120, and the shielding regions 160. The gate electrode 155 may be electrically connected to a gate metallization at the front side of the silicon carbide body 100. The gate metallization forms or is electrically connected or coupled to a gate terminal.

Portions of an interlayer dielectric 210 separate the first load electrode 310 and the gate electrode 155 in the gate structures 150. The first load electrode 310 may form or may be electrically connected with or coupled to a first load terminal, which may be an anode terminal of an MCD or a source terminal of an MOSFET.

A second load electrode 320 forms a low-resistive ohmic contact with the contact portion 139. The second load electrode 320 may form or may be electrically connected with or coupled to a second load terminal, which may be a cathode terminal of an MCD or a drain terminal of an MOSFET.

The illustrated silicon carbide device 500 is an re-channel SiC TMOSFET, wherein the first load electrode 310 forms or is electrically connected or coupled to a source terminal S and wherein the second load electrode 320 forms or is electrically connected or coupled to a drain terminal D. The silicon carbide device 500 includes a plurality of transistor cells TC and a plurality of gate structures 150. The transistor cells TC may be electrically connected in parallel.

In FIGS. 3A-3D deep sections 163 of the deep shielding portion 169 form contiguous stripes with longitudinal axes parallel to the horizontal first direction 291.

In FIGS. 4A-4D a horizontal cross-sectional area of the deep shielding portion 169 forms a grid with grid openings 167. Each grid opening 167 is formed around a source region 110.

Figure 5A:
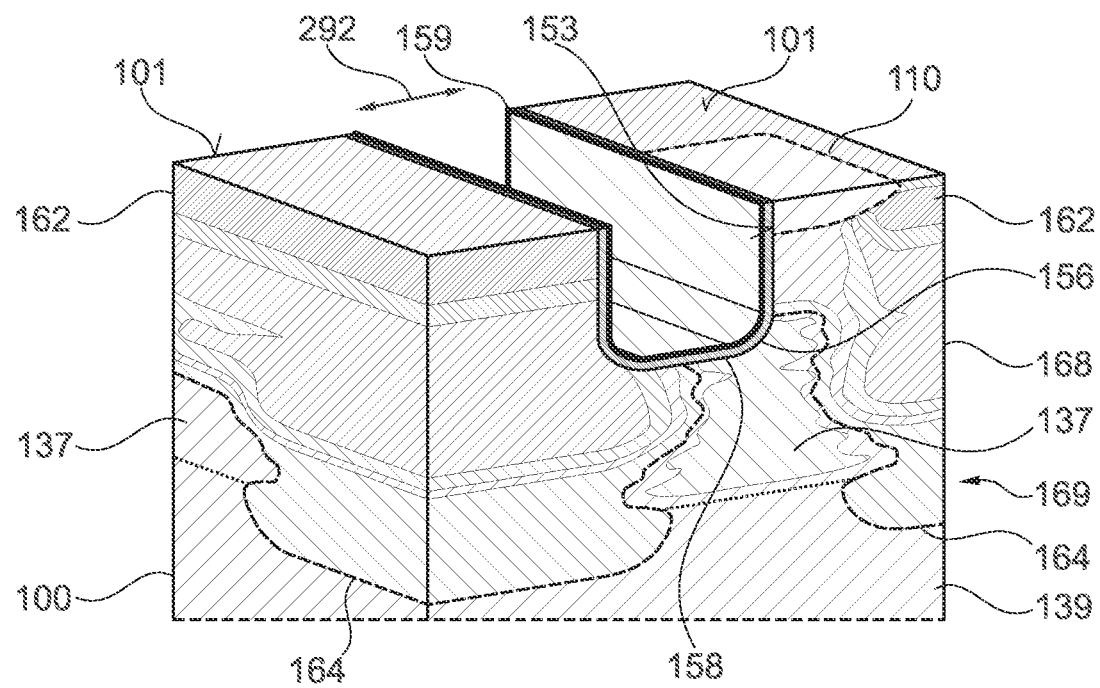
FIGS. 5A-5B illustrate schematic perspective views of a portion of a silicon carbide device according to another embodiment with a shielding region including laterally separated deep sub-sections.
Figure 5B:
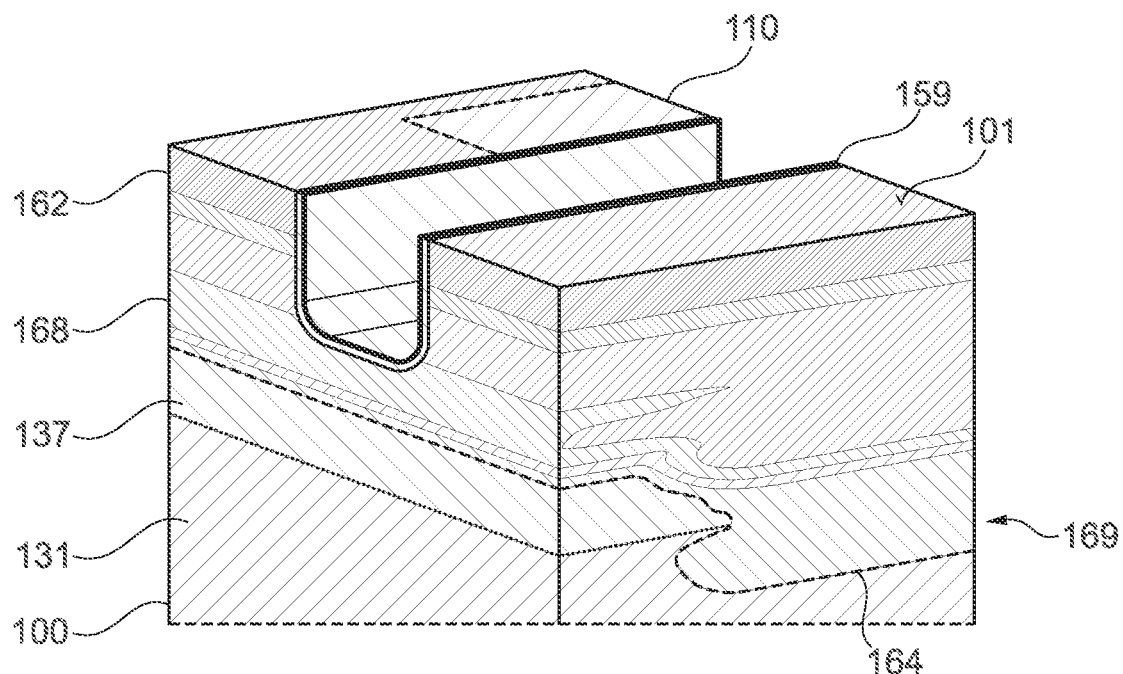

FIGS. 5A-5B show perspective views of a silicon carbide device 500 with source regions 110 formed along channel sidewall sections 153 of the first gate sidewalls 151. The deep shielding portions 169 include dot-shaped deep sub-sections 164. The shielding regions 160 include a heavily doped contact section 162 formed along the first surface 101.

Figure 6A:
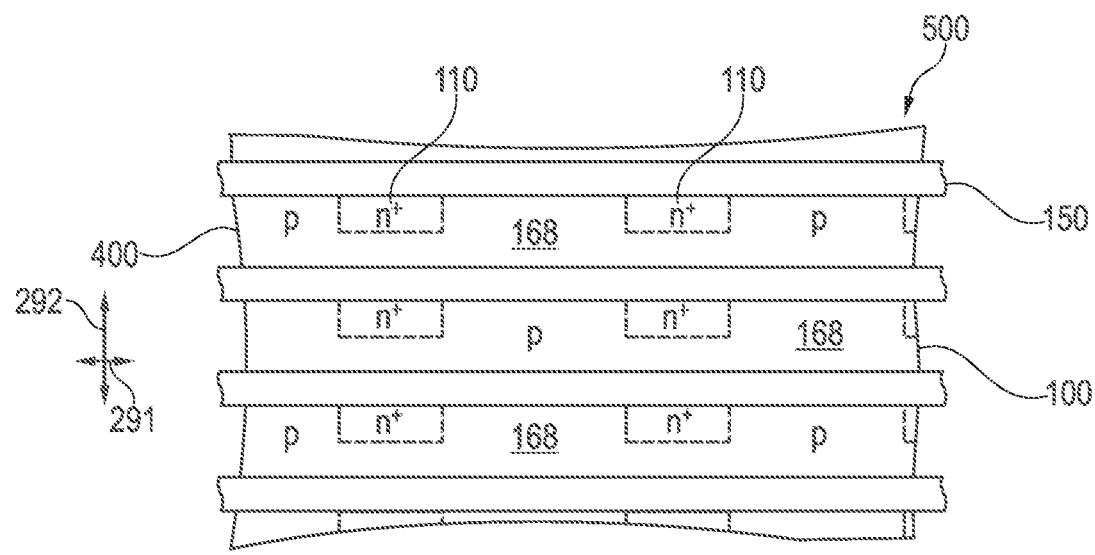
FIGS. 6A-6C illustrate schematic horizontal cross-sectional views of portions of silicon carbide devices according to further embodiments.
Figure 6B:
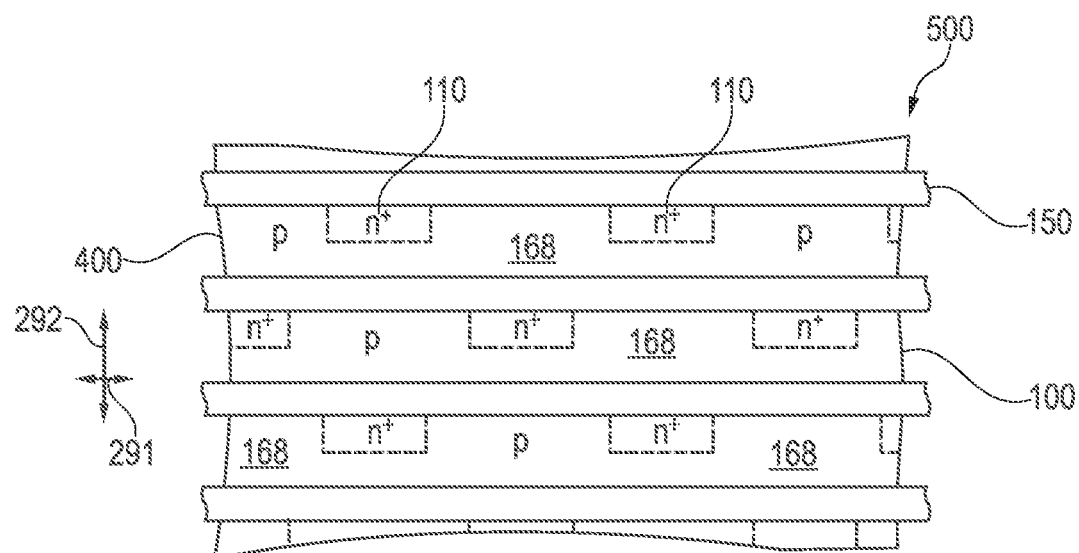

FIGS. 6A and 6B refer to silicon carbide devices 500 with a plurality of gate structures 150. A plurality of source regions 110 is formed along the first gate sidewalls 151 of the gate structures 150. Along the first surface 101, top shielding portions 168 of shielding regions and the source regions 110 complement each other to a second contiguous area 400 between two neighboring gate structures 150.

In FIG. 6A the source regions 110 are arranged matrix-like in lines and rows, wherein the rows run orthogonal to the lines. In other words, the source regions 110 are formed in the black and in the white fields of a checkerboard.

In FIG. 6B the source regions 110 of neighboring gate structures 150 are shifted to each other by half the center-to-center distance between neighboring source regions 110 along the first direction 291. In other words, the source regions 110 may be formed only in the "white" fields of a checkerboard.

Figure 6C:
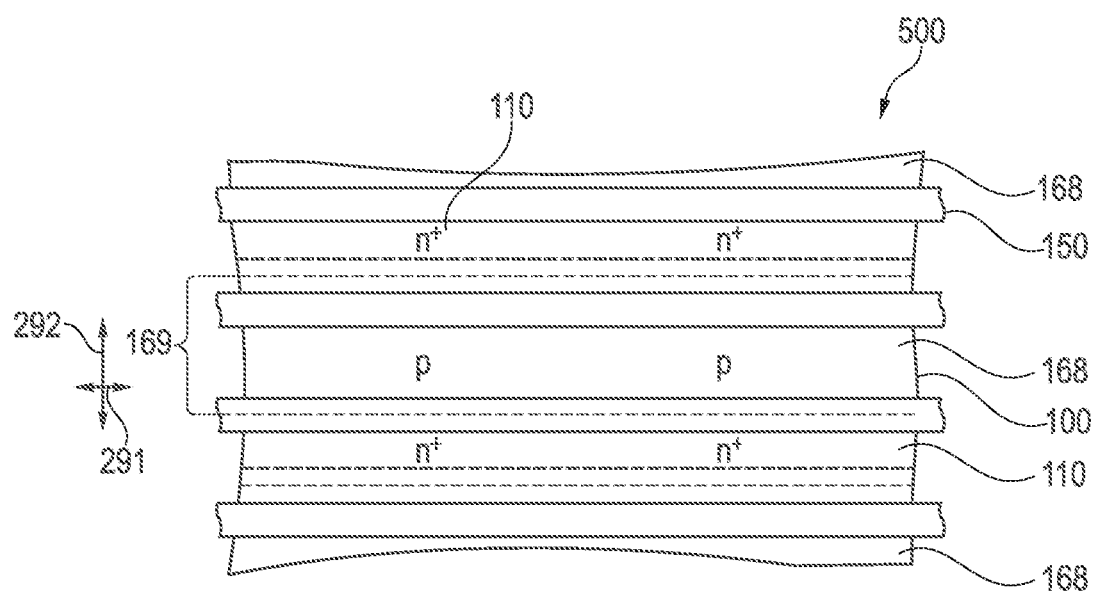

In FIG. 6C each source region 110 extends along the complete gate length of gate structures 150 of a first type and are completely absent along the first gate sidewalls 151 of gate structures 150 of a second type. Gate structures 150 of the first type and of the second type may form a regular pattern. For example, one, two, three or more gate structures 150 of the first type (in contact with source regions 110) may be formed between each pair of gate structures 150 of the second type (without contact to source regions 110).

For illustration, various scenarios have been described with respect to a silicon carbide device. Similar techniques may be implemented in semiconductor devices based on other kinds and types of compound semiconductors material for a semiconductor body, e.g., gallium nitride (GaN) or gallium arsenide (GaAs), etc.

For illustration, various scenarios have been described with respect to a silicon carbide device without integrated Schottky diode. Some of the embodiments may be combined with Schottky contacts between the front side electrode and diode regions of the first conductivity type. The diode regions may extend between neighboring gate structures from the first surface to the drift structure. Alternatively or in addition, separation sections may laterally separate Schottky contacts from source regions. For example, p doped separation sections may laterally separate n-doped diode regions from n doped source regions.

What is claimed is:

1. A method of producing a silicon carbide device, the method comprising:
   forming a stripe-shaped trench gate structure that extends from a first surface of a silicon carbide body into the silicon carbide body, the gate structure having a gate length along a lateral first direction, wherein a bottom surface and a first gate sidewall of the gate structure are connected via a first bottom edge of the gate structure;
   forming at least one source region of a first conductivity type; and
   forming a shielding region of a second conductivity type in contact with the first bottom edge of the gate structure across at least 20% of the gate length,
   wherein forming the shielding region comprises:
   forming a deep shielding portion; and
   forming a top shielding portion between the first surface and the deep shielding portion, the top shielding portion being in contact with the first bottom edge,
   wherein forming the deep shielding portion comprises forming a plurality of deep sub-sections arranged along parallel lines and parallel rows, the parallel rows running orthogonal to the parallel lines,
   wherein for a plurality of the deep sub-sections, each deep sub-section is formed between two neighboring source regions along a lateral second direction orthogonal to the lateral first direction.

2. The method of claim 1, wherein the deep shielding portion and the top shielding portion are directly connected with each other along a vertical direction.

3. The method of claim 1, wherein a vertical extension of the top shielding portion is greater than a vertical extension of the stripe-shaped trench gate structure.

4. The method of claim 1, wherein the deep sub-sections are laterally separated from the source regions.

5. The method of claim 1, wherein along the lateral first direction, neighboring deep sub-sections of the same row are laterally separated.

6. The method of claim 1, wherein along the lateral first direction, a length of the deep sub-sections is equal to a length of the source regions.

7. The method of claim 1, wherein along the lateral first direction, a length of the deep sub-sections is smaller than a length of the source regions.

8. The method of claim 1, wherein along the lateral first direction, a length of the deep sub-sections is greater than a length of the source regions.

9. The method of claim 1, wherein forming the plurality of deep sub-sections comprises:
   defining the deep sub-sections by an implant mask having rounded openings such that horizontal cross-sectional areas of the deep sub-sections include circular segments, oval segments, circles and/or ovals.

10. The method of claim 1, wherein forming the top shielding portion comprises:
    defining the top shielding portion by an implant mask that includes rounded columns such that horizontal cross-sectional areas of openings in the top shielding portion are circular segments, oval segments, circles and/or ovals.

11. The method of claim 1, wherein along a lateral second direction orthogonal to the lateral first direction, a first distance between the top shielding portion and the first gate sidewall is smaller than a second distance between the deep shielding portion and the first gate sidewall.

12. The method of claim 1, further comprising:
    forming a load electrode above the first surface of the silicon carbide body; and
    electrically connecting the load electrode with the at least one source region and the shielding region.

13. The method of claim 1, wherein forming the shielding region comprises:
    using a same implant mask to define both the deep shielding portion and the top shielding portion.

14. The method of claim 1, wherein horizontal cross-sectional areas of the top shielding portion and the deep shielding portion are different.

15. The method of claim 14, wherein forming the shielding region comprises:
    using different implant masks to define the deep shielding portion and the top shielding portion.

16. The method of claim 1, wherein forming the shielding region comprises:
    implanting the deep shielding portion and the top shielding portion such that the top shielding portion and the deep shielding portion overlap with each other and one or more end-of-range implant peaks that define the deep shielding portion are located within the top shielding portion.

17. The method of claim 1, wherein the deep shielding portion is continuous along a vertical direction.

18. The method of claim 1, wherein the at least one source region and the top shielding portion are formed by implanting using different implant masks, and wherein along the lateral first direction, openings in the implant mask used for implanting the at least one source region are narrower than a length of mask columns of the implant mask used for implanting the top shielding portion.

19. A method of producing a silicon carbide device, the method comprising:
    forming a stripe-shaped trench gate structure that extends from a first surface of a silicon carbide body into the silicon carbide body, the gate structure having a gate length along a lateral first direction, wherein a bottom surface and a first gate sidewall of the gate structure are connected via a first bottom edge of the gate structure;
    forming at least one source region of a first conductivity type; and
    forming a shielding region of a second conductivity type in contact with the first bottom edge of the gate structure across at least 20% of the gate length,
    wherein forming the shielding region comprises:
    forming a deep shielding portion; and
    forming a top shielding portion between the first surface and the deep shielding portion, the top shielding portion being in contact with the first bottom edge,
    wherein forming the shielding region comprises implanting the deep shielding portion and the top shielding portion such that the top shielding portion and the deep shielding portion overlap with each other and one or more end-of-range implant peaks that define the deep shielding portion are located within the top shielding portion.

20. A method of producing a silicon carbide device, the method comprising:
- forming a stripe-shaped trench gate structure that extends from a first surface of a silicon carbide body into the silicon carbide body, the gate structure having a gate length along a lateral first direction, wherein a bottom surface and a first gate sidewall of the gate structure are connected via a first bottom edge of the gate structure;
- forming at least one source region of a first conductivity type; and
- forming a shielding region of a second conductivity type in contact with the first bottom edge of the gate structure across at least 20% of the gate length,
- wherein forming the shielding region comprises:
  - forming a deep shielding portion; and
  - forming a top shielding portion between the first surface and the deep shielding portion, the top shielding portion being in contact with the first bottom edge,
- wherein the at least one source region and the top shielding portion are formed by implanting using different implant masks,
- wherein along the lateral first direction, openings in the implant mask used for implanting the at least one source region are narrower than a length of mask columns of the implant mask used for implanting the top shielding portion.

* * * * *